(12) United States Patent
Clavero et al.

(10) Patent No.: US 10,287,673 B2
(45) Date of Patent: May 14, 2019

(54) COATED ARTICLE HAVING LOW-E COATING WITH IR REFLECTING LAYER(S) AND YTTRIUM INCLUSIVE HIGH INDEX NITRIDED DIELECTRIC LAYER

(71) Applicant: Guardian Glass, LLC, Auburn Hills, MI (US)

(72) Inventors: Cesar Clavero, San Jose, CA (US); Guowen Ding, San Jose, CA (US); Daniel Lee, San Jose, CA (US); Scott Jewhurst, San Jose, CA (US); Daniel Schweigert, San Jose, CA (US); Gaurav Saraf, San Jose, CA (US); Guizhen Zhang, San Jose, CA (US); Minh Le, San Jose, CA (US); Marcus Frank, Gelhausen (DE); Nestor P. Murphy, West Bloomfield, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 80 days.

(21) Appl. No.: 15/451,518

(22) Filed: Mar. 7, 2017

(65) Prior Publication Data
US 2018/0258524 A1 Sep. 13, 2018

(51) Int. Cl.
*C23C 14/34* (2006.01)
*C23C 14/06* (2006.01)
(Continued)

(52) U.S. Cl.
CPC ......... *C23C 14/3464* (2013.01); *C03C 17/36* (2013.01); *C03C 17/366* (2013.01);
(Continued)

(58) Field of Classification Search
None
See application file for complete search history.

(56) References Cited

U.S. PATENT DOCUMENTS

| 4,883,721 A | 11/1989 | Nalepka et al. |
| 5,344,718 A | 9/1994 | Hartig et al. |
| (Continued) | | |

FOREIGN PATENT DOCUMENTS

| EP | 2 746 236 | 6/2014 |
| WO | WO 2018/017329 | 1/2018 |

OTHER PUBLICATIONS

U.S. Appl. No. 15/448,620, filed Mar. 3, 2017; Saraf et al.
U.S. Appl. No. 15/448,629, filed Mar. 3, 2017; Ding et al.
U.S. Appl. No. 15/448,739, filed Mar. 3, 2017; Zhang et al.

*Primary Examiner* — Lauren R Colgan
(74) *Attorney, Agent, or Firm* — Nixon & Vanderhye P.C.

(57) ABSTRACT

A coated article includes a low emissivity (low-E) coating having at least one infrared (IR) reflecting layer of a material such as silver, gold, or the like, and at least one yttrium (Y) inclusive high index nitrided dielectric layer. In certain example embodiments, the yttrium inclusive high index nitrided dielectric layer(s) may be of or include one or more of YZrSiAlN, YZrSiN, YSiN, and/or YSiAlN. The high index layer may be a transparent dielectric high index layer, with a high refractive index (n) and low k value, in preferred embodiments and may be provided for antireflection purposes and/or visible transmission purposes, and/or for improving thermal stability. In certain example embodiments, the low-E coating may be used in applications such as monolithic or insulating glass (IG) window units, vehicle windows, or the like.

53 Claims, 6 Drawing Sheets
(2 of 6 Drawing Sheet(s) Filed in Color)

(51) Int. Cl.
*C23C 14/08* (2006.01)
*C23C 14/35* (2006.01)
*C03C 17/36* (2006.01)

(52) U.S. Cl.
CPC ...... *C03C 17/3644* (2013.01); *C03C 17/3652* (2013.01); *C03C 17/3681* (2013.01); *C23C 14/0652* (2013.01); *C23C 14/086* (2013.01); *C23C 14/35* (2013.01); *C03C 2218/154* (2013.01)

(56) References Cited

U.S. PATENT DOCUMENTS

| | | | |
|---|---|---|---|
| 5,723,207 A * | 3/1998 | Lettington | C23C 14/0641 204/192.12 |
| 6,210,784 B1 | 4/2001 | Rondeau et al. | |
| 6,355,334 B1 | 3/2002 | Rondeau et al. | |
| 6,576,349 B2 | 6/2003 | Lingle et al. | |
| 6,602,608 B2 | 8/2003 | Stachowiak | |
| 6,610,410 B2 | 8/2003 | Ebisawa et al. | |
| 7,005,188 B2 | 2/2006 | Anderson et al. | |
| 7,081,301 B2 | 7/2006 | Stachowiak | |
| 7,153,579 B2 | 12/2006 | Kriltz et al. | |
| 7,241,506 B2 | 7/2007 | Hartig | |
| 7,390,572 B2 | 6/2008 | Butz et al. | |
| 8,263,227 B2 | 9/2012 | Disteldorf et al. | |
| 8,945,714 B2 | 2/2015 | Lao et al. | |
| 9,028,956 B2 | 5/2015 | Knoll et al. | |
| 9,028,983 B2 | 5/2015 | Imran et al. | |
| 9,052,456 B2 | 6/2015 | Hassan et al. | |
| 9,199,874 B2 | 12/2015 | Peter et al. | |
| 9,212,417 B2 | 12/2015 | Frank et al. | |
| 9,297,197 B2 | 3/2016 | Lao et al. | |
| 9,315,414 B2 | 4/2016 | Hassan et al. | |
| 9,365,450 B2 | 6/2016 | Ding et al. | |
| 9,371,684 B2 | 6/2016 | Butz et al. | |
| 9,403,345 B2 | 8/2016 | Lao et al. | |
| 9,410,359 B2 | 8/2016 | Ding et al. | |
| 9,494,717 B2 | 11/2016 | Reymond et al. | |
| 9,499,437 B2 | 11/2016 | Imran et al. | |
| 9,518,319 B2 | 12/2016 | Ding et al. | |
| 9,556,070 B2 | 1/2017 | Wuillaume et al. | |
| 2005/0079369 A1 | 4/2005 | Stachowiak | |
| 2006/0023327 A1* | 2/2006 | Coombs | G02B 5/0816 359/883 |
| 2010/0178492 A1 | 7/2010 | Schicht et al. | |
| 2013/0059137 A1* | 3/2013 | Hevesi | C03C 17/36 428/213 |
| 2014/0090864 A1* | 4/2014 | Paulson | C03C 17/225 174/50 |
| 2016/0354995 A1* | 12/2016 | Lienhart | B32B 15/04 |
| 2018/0258524 A1* | 9/2018 | Clavero | C23C 14/3464 |

* cited by examiner

Fig. 6

| | | | AC-54-04 | |
|---|---|---|---|---|
| | | | AC | HT |
| T | | Y (%) | 88.86 | 88.97 |
| | | a* | -1.42 | -1.37 |
| | | b* | 2.79 | 2.1 |
| Monolithic Optics (Ill 'C; 2 deg obs) | Rg | Y (%) | 5.91 | 5.55 |
| | | a* | 0.98 | 2.03 |
| | | b* | -10.77 | -10.28 |
| | Rf | Y (%) | 4.85 | 4.23 |
| | | a* | 2.53 | 2.25 |
| | | b* | -12.38 | -9.01 |
| | A[vis] (100-TT-Rf) | | 6.29 | 6.8 |
| | A[vis] (100-TT-Rg) | | 5.23 | 5.48 |
| Rs (ohms/sq) | | | 0.044 | 0.037 |
| Normal Emissivity (Eₙ) | | | | |
| Haze (%) | | | 0.09 | 1.47 |
| HT - AC | Rf ΔE* | | | 3.87 |
| | Rg ΔE* | | | 1.48 |
| | T ΔE* | | | 0.69 |
| | T [Δb*] | | | 0.69 |
| | T ΔY% (HT > AC) | | | 0.11 |
| EN410 Thermal Performance | Tvis (%) | | 72.6 | 72.6 |
| | Tsol (%) | | 48.5 | 48.1 |
| | Rsol (%) | | 29.2 | 28.1 |
| | Asol (%) | | 22.4 | 23.8 |
| | Uval | | 0.6 | 0.6 |
| | SHGC | | 55.7 | 55.8 |
| | LSG | | 1.30 | 1.30 |

| Example 4 | | | HT |
|---|---|---|---|
| T | Y (%) | | 89.88 |
| | a* | | -1.54 |
| | b* | | 1.27 |
| Monolithic Optics (Ill 'C', 2 deg obs) | Rg | Y (%) | 5.59 |
| | | a* | 1.79 |
| | | b* | -6.66 |
| | Rf | Y (%) | 4.52 |
| | | a* | 1.99 |
| | | b* | -6.22 |
| Rs (ohms/sq) | | | 3.85 |
| Normal Emissivity (En) | | | 0.030 |
| EN410 Thermal Performance | Tvis (%) | | 74.2 |
| | Tsol (%) | | 49.1 |
| | Rsol (%) | | 30.1 |
| | Asol (%) | | 20.8 |
| | Uval | | 0.579 |
| | SHGC | | 55.6 |
| | LSG | | 1.33 |

Fig. 7

COATED ARTICLE HAVING LOW-E COATING WITH IR REFLECTING LAYER(S) AND YTTRIUM INCLUSIVE HIGH INDEX NITRIDED DIELECTRIC LAYER

This application relates to a coated article including a low emissivity (low-E) coating having at least one infrared (IR) reflecting layer of a material such as silver, gold, or the like, and at least one yttrium (Y) inclusive high index nitrided dielectric layer. In certain example embodiments, the yttrium inclusive high index nitrided dielectric layer(s) may be of or include one or more of YZrSiAlN, YZrSiN, YSiN, and/or YSiAlN. The high index layer may be a transparent dielectric high index layer, with a high refractive index (n) and low k value, in preferred embodiments and may be provided for antireflection purposes and/or visible transmission purposes, and/or for improving thermal stability. In certain example embodiments, the low-E coating may be used in applications such as monolithic or insulating glass (IG) window units, vehicle windows, or the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like.

Conventional low-E coatings are disclosed, for example and without limitation, in U.S. Pat. Nos. 6,576,349, 9,212,417, 9,297,197, 7,390,572, 7,153,579, and 9,403,345, the disclosures of which are hereby incorporated herein by reference.

Certain low-E coating utilize at least one transparent dielectric layer of titanium oxide (e.g., $TiO_2$), which has a high refractive index (n), for antireflection and/or coloration purposes. See for example U.S. Pat. Nos. 9,212,417, 9,297,197, 7,390,572, 7,153,579, and 9,403,345. Although high refractive index dielectric materials such as $TiO_2$ are known and used in low-E coatings, these materials are not thermally stable and are typically not heat stable after tempering process of about 650 C for 8 minutes, due to film crystallization (or change in crystallinity) in as-deposited or post-tempering state, which may in turn induce thermal or lattice stress on adjacent layers in the film stack. Such stress can further cause change in physical or material properties of the stack and hence impact on the Ag layer, which results in deteriorated low E stack performance. Moreover, $TiO_2$ dielectric layers in low-E coatings suffer from having a very low deposition rate during sputter-deposition of low-E coatings, thereby leading to significantly high costs associated with making low-E coatings.

Example embodiments of this invention solve these problems by providing a high index (high refractive index value n, measured at 550 nm) and low absorption (low k value, measured at 400 nm) yttrium (y) inclusive nitrided dielectric layer for use in low-E coatings. Unlike $TiO_2$ dielectric layers, the high index yttrium inclusive dielectric layers herein have been found to be heat treatable so as to be substantially thermally stable upon heat treatment (HT), and can be sputter-deposited at much higher sputter-deposition rates than can $TiO_2$. In certain example embodiments, the yttrium inclusive high index nitrided dielectric layer(s) may be of or include one or more of YZrSiAlN, YZrSiN, YSiN, and/or YSiAlN. It has been found that adding Y to ZrSiAlN for example allows widening of its band-gap, and thus lowers considerably the optical absorption (k) while having a high refractive index (n). The same applies to adding Y to ZrSiN, SiN and SiAlN in certain example embodiments. These materials have also been found to be heat stable (e.g., the variation of refractive index n may be no greater than 0.1 due to HT such as thermal tempering at about 650° C.). In certain example embodiments, the low-E coating may be used in applications such as monolithic or insulating glass (IG) window units, vehicle windows, or the like. While Y inclusive high index nitrided dielectric layers discussed herein are preferably used in low-E coatings, this invention is not so limited and these layers may be used in other thin film coatings such as for high index layers in antireflective (AR) coatings.

"Heat treatment" (HT) and like terms such as "heat treating" and "heat treated", such as thermal tempering, heat strengthening, and/or heat bending, as used herein means heat treating the glass substrate and coating thereon at temperature of at least 580 degrees C. for at least 5 minutes. An example heat treatment is heat treating at temperature of about 600-650 degrees C. for at least 8 minutes.

In an example embodiment of this invention, there is provided a coated article including a coating supported by a glass substrate, the coating comprising: a first dielectric layer on the glass substrate; an infrared (IR) reflecting layer comprising silver on the glass substrate, located over at least the first dielectric layer; a second dielectric layer on the glass substrate, located over at least the IR reflecting layer; and wherein at least one of the first and second dielectric layers comprises a nitride of yttrium (Y), contains from 0-10% oxygen (atomic %), has a refractive index (n) of at least 2.21 at 550 nm, and further comprises at least one of Zr, Si, and Al. Uyoouyio In an example embodiment of this invention, there is provided a coated article including a coating supported by a glass substrate, the coating comprising: a first dielectric layer on the glass substrate; an infrared (IR) reflecting layer on the glass substrate, located over at least the first dielectric layer; a second dielectric layer on the glass substrate, located over at least the IR reflecting layer; a third dielectric layer on the glass substrate and located over at least the first and second dielectric layers; and wherein at least one of the first and second dielectric layers comprises a nitride of yttrium (Y), and further comprises at least one of Zr, Si, and Al.

In an example embodiment of this invention, there is provided a method of making a coated article including a coating supported by a glass substrate, the method comprising: sputter depositing a first dielectric layer on the glass substrate; sputter depositing a second dielectric layer on the glass substrate, located over at least the first dielectric layer; sputter depositing a third dielectric layer on the glass substrate and located over at least the first and second dielectric layers; and wherein at least one of the first and second dielectric layers comprises a nitride of yttrium (Y), and further comprises at least one of Zr, Si, and Al. The coating may be a low-E coating or an antireflective (AR) coating.

BRIEF DESCRIPTION OF THE DRAWINGS

This patent or application file contains at least one drawing executed in color. Copies of this patent or patent application publication with color drawing(s) will be provided by the Office upon request and payment of the necessary fee.

FIG. 6 is a chart setting forth optical/thermal data for an example coated article according to an example embodiment of this invention.

FIG. 7 is a chart setting forth optical/thermal data for the coated article of Example 4.

DETAILED DESCRIPTION OF EXAMPLE EMBODIMENTS OF THE INVENTION

Figure 1:
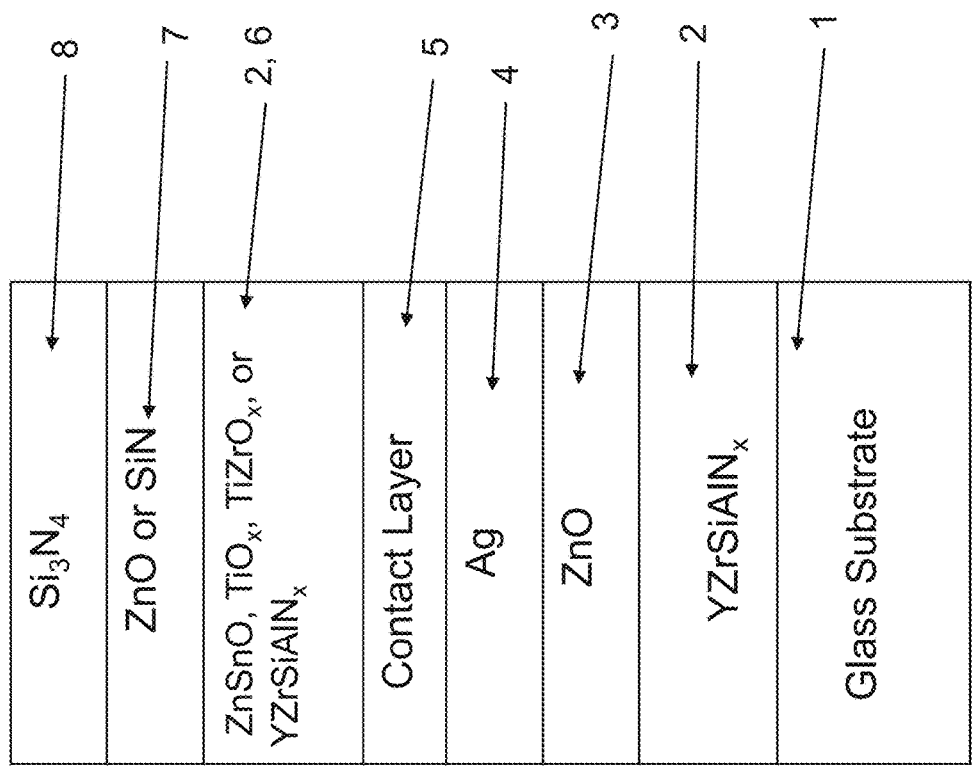
FIG. 1 is a cross sectional view of a coated article according to an example embodiment of this invention.

Referring now to the drawings in which like reference numerals indicate like parts throughout the several views.

Coated articles herein may be used in applications such as monolithic windows, IG window units such as residential windows, patio doors, vehicle windows, and/or any other suitable application that includes single or multiple substrates such as glass substrates.

Conventional high refractive index material such as $TiO_2$ with low or no light absorption in the visible range is often used in low-E coatings in window applications. However, $TiO_2$ is typically not heat stable after a thermal tempering process such as involving HT at about 650 C for 8 minutes, due to film crystallization (or change in crystallinity) in as-deposited or post-tempering state, which may in turn induce thermal or lattice stress on adjacent layers in the film stack. Such a stress can further cause change in physical or material properties of the stack and hence impact on the IR reflecting Ag based layer, which results in deteriorated low E stack performance. $TiO_2$ layers also suffer from a very low sputter-deposition rate.

Figure 3:
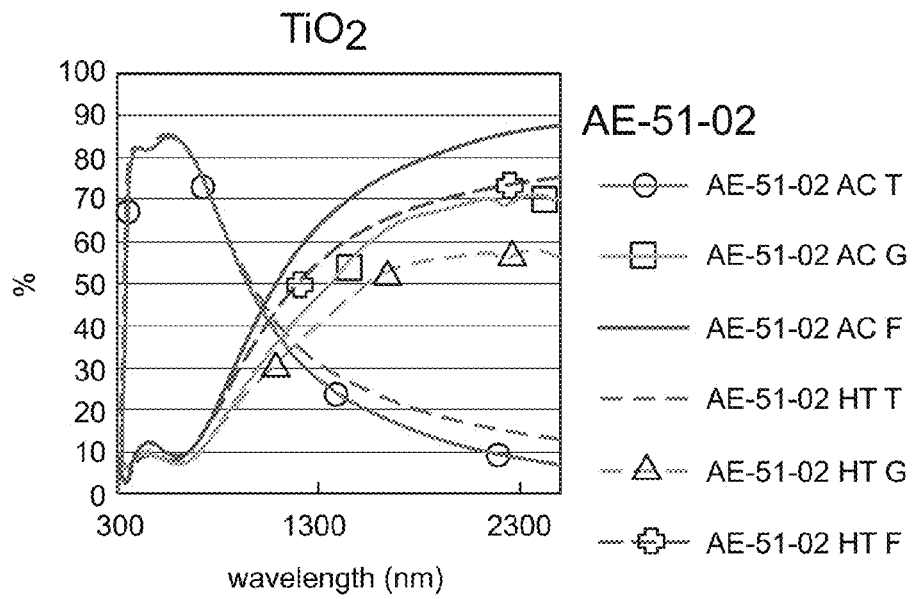
FIG. 3 is a percentage (%) versus wavelength (nm) graph plotting transmission (T) %, glass side reflection (G) %, and film side reflection (F) % of a layer stack including a high index $TiO_2$ layer versus wavelength (nm) in both as-coated (AC) and post-HT (HT) states.

FIG. 3 illustrates that $TiO_2$ is not thermally stable, and thus is not heat treatable from a practical point of view. FIG. 3 is a percentage (%) versus wavelength (nm) graph plotting transmission (T) %, glass side reflection (G) %, and film side reflection (F) % of a layer stack including a high index titanium oxide layer versus wavelength (nm) in both as-coated (AC) and post-HT states. The layer stack was glass/$TiO_2$ (27 nm)/ZnO (4 nm)/Ag (11 nm)/NiTiNbO$_x$(2.4 nm)/ZnSnO (10 nm)/ZnO (4 nm)/SiN (10 nm), where the ZnO layers were doped with Al in this Comparative Example (CE) stack. Thus, the AC curves are prior to HT, and the HT curves are after heat treatment at about 650 degrees C. for about eight minutes. In FIG. 3, at the right side where the curves are listed, the top three are as coated (AC) which means prior to the HT, and the bottom three are following the heat treatment and thus are labeled "HT." FIG. 3 shows that the layer stack with the crystalline $TiO_2$ is not thermally stable and thus not practically heat treatable. In particular, the Comparative Example (CE) of FIG. 3 shows a significant shift in the IR range of the transmission and reflectance spectra, and increases in emissivity and haze were also found. In FIG. 3, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability.

Example embodiments of this invention solve these problems by providing a high index (high refractive index value n, measured at 550 nm) and low absorption (low k value, measured at 400 nm) yttrium (y) inclusive nitrided dielectric layer 2 (and possibly layer 6) for use in low-E coatings. Unlike $TiO_2$ dielectric layers, the high index yttrium inclusive dielectric layers 2 (and possibly 6) herein have been found to be heat treatable so as to be substantially thermally stable upon heat treatment (HT), and can be sputter-deposited at much higher sputter-deposition rates than can $TiO_2$. In certain example embodiments, the yttrium inclusive high index nitrided dielectric layer(s) 2 (and possibly 6) may be of or include one or more of YZrSiAlN, YZrSiN, YSiN, and/or YSiAlN (in various stoichiometries). The chemical representations herein where any of Y, Zr, and/or N is/are included are provided for purposes of simplicity and understanding, and are not necessarily stoichiometric. For example, YZrSiAlN does not mean that equal amounts of Y, Zr, Si, Al and N are provided. Instead, for example and without limitation, a YZrSiAlN layer may include more or less Y than any of Zr, Si, or Al.

It has been found that adding Y to ZrSiAlN for example allows widening of its band-gap, and thus lowers considerably the optical absorption (k) while having a high refractive index (n). The same applies to adding Y to ZrSiN, SiN and SiAlN in certain example embodiments. These materials have also been found to be heat stable (e.g., the variation of refractive index n may be no greater than 0.1 due to HT such as thermal tempering at about 650° C.). In certain example embodiments, the low-E coating may be used in applications such as monolithic or insulating glass (IG) window units, vehicle windows, or the like. While Y inclusive high index nitrided dielectric layers discussed herein are preferably used in low-E coatings, this invention is not so limited and these layers may be used in other thin film coatings such as for high index layers in antireflective (AR) coatings.

ZrSiAlN exhibits an absorption coefficient k that can be too large for certain optical coating applications. In certain embodiments of this invention, it has been found that adding amounts of Y to ZrSiAlN (or to SiAlN, or to SiN, or to ZrSiN) allows widening its band-gap, and thus lowers considerably the optical absorption while providing a high refractive index. The extinction coefficient k at a wavelength of about 400 nm (3.1 eV) in these nitrides is related to their band-gap. Photons with wavelenths around 400 nm cannot reasonably be absorbed in materials with bandgaps higher than 3.1 eV, leading to low or no absorption. On the other hand, bandgaps around 3.1 eV or lower lead to significant optical absorption. The width of the band-gap correlates with the difference in electronegativity between the metal element and nitrogen. Y exhibits a high difference in electronegativity with a value of 1.82 (N=3.04), which allows it to increase the bandgap of ZrSiAlN and other like nitrides, and thus lower absorption thereby increasing transmission. While YN is a non-stable salt-like nitride, we have found that adding Y to ZrSiAlN and like nitrides leads to a thermally stable high refractive index nitride with lower optical absorption and thus higher transmission.

In certain example embodiments of this invention, yttrium inclusive high index nitrided dielectric layer(s) 2 (and possibly 6) of or including YZrSiAlN, YZrSiN, YSiN, and/or YSiAlN may have a high refractive index (n) of at least 2.21, more preferably of at least 2.23, more preferably of at least 2.25, even more preferably of at least 2.30 (at 550 nm), and a low absorption coefficient (k) of no greater than 0.02, more preferably no greater than 0.015, even more preferably no greater than 0.010 (at 400 nm). In addition, coated articles according to example embodiments of this invention are thermally stable, and realize a refractive index (n) change after 650° C. heat treatment for 8 minutes of no more than 0.10, more preferably no more than 0.04, and most preferably no more than 0.01. Such yttrium inclusive high index nitrided dielectric layer(s) of or including YZrSiAlN, YZrSiN, YSiN, and/or YSiAlN may be used to replace high index $TiO_2$ or niobium oxide (e.g., $Nb_2O_5$) layers in any low-E or AR coating stack in example embodiments of this invention, in order to realize advantages discussed herein.

It has been found that fairly high yttrium (Y) content works best for achieving advantages discussed herein. For example, and without limitation, metal content of an example YZrSiAlN layer 2 and/or 6 is 37% Y, 54.4% Si, 5.6% Zr, and 2.7% Al (atomic %). Note that Si is considered a metal herein. In certain example embodiments of this invention, metal content of the yttrium inclusive high index nitrided dielectric layer 2 and/or 6, of or including one or more of YZrSiAlN, YZrSiN, YSiN, and/or YSiAlN, may contain one or more of: (i) from 20-70% Y, more preferably from 25-65% Y, even more preferably from 30-50% Y, and most preferably from 33-45% Y (atomic %); (ii) from 0-30% Zr, more preferably from 1-30% Zr, even more preferably from 3-13% Zr, and most preferably from 4-10% Zr (atomic %); (iii) from 30-80% Si, more preferably from 40-70% Si, even more preferably from 45-65% Si (atomic %); and (iv) from 0-30% Al, more preferably from 1-30% Al, even more preferably from 1-8% Al, and most preferably from 2-6% Al (atomic %). In certain example embodiments, the Y-inclusive layer contains more Si than Y, such as at least 10% more Si than Y (atomic %). In certain example embodiments, Y has the highest atomic % metal content of any metal in layer 2 and/or 6 when the layer comprises a nitride of Y such as YZrSiAlN, YZrSiN, YSiN, and/or YSiAlN.

In certain example embodiments of this invention, metal content of the yttrium inclusive high index nitrided dielectric layer 2 and/or 6, of or including one or more of YZrSiAlN, YZrSiN, YSiN, and/or YSiAlN, is free of or substantially free of Ti and Nb. In certain example embodiments, nitrided dielectric layer 2 and/or 6, of or including one or more of YZrSiAlN, YZrSiN, YSiN, and/or YSiAlN, contains from 0-10% of Ti, more preferably from 0-5% Ti, and most preferably from 0-2% of Ti. In certain example embodiments, nitrided dielectric layer 2 and/or 6, of or including one or more of YZrSiAlN, YZrSiN, YSiN, and/or YSiAlN, contains from 0-10% of Nb, more preferably from 0-5% Nb, and most preferably from 0-2% of Nb.

While oxygen is not preferred in yttrium inclusive high index nitrided dielectric layer(s) 2 (and possibly 6) of or including YZrSiAlN, YZrSiN, YSiN, and/or YSiAlN discussed herein, it is possible that these layers may contain a small amount of oxygen. For example, yttrium inclusive high index nitrided dielectric layer(s) 2 (and possibly 6) of or including YZrSiAlN, YZrSiN, YSiN, and/or YSiAlN may contain from 0-10% oxygen more preferably from 0-5% oxygen, and most preferably from 0-2% oxygen (atomic %).

FIG. 1 is a cross sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating (or layer system) provided on the substrate 1 either directly or indirectly. The example low-E coating according to the FIG. 1 embodiment may yttrium inclusive high index nitrided dielectric layer(s) 2 of or including YZrSiAlN, YZrSiN, YSiN, and/or YSiAlN as discussed herein, zinc oxide and/or zinc stannate inclusive contact layer 3 (e.g., $ZnO_x$ where "x" may be about 1; or $ZnAlO_x$), IR (infrared) reflecting layer 4 including or of silver, gold, or the like, upper contact layer 5 of or including an oxide of Ni and/or Cr (e.g., $NiCrO_x$) or other suitable material, and a dielectric overcoat of or including dielectric layer 6 that may be a medium index layer such as zinc oxide or zinc stannate, or may be a high index layer such titanium oxide (e.g., $TiO_2$), zirconium-doped titanium oxide, or a yttrium inclusive high index nitrided dielectric layer of or including YZrSiAlN, YZrSiN, YSiN, and/or YSiAlN discussed herein, optional medium index layer 7 of or including zinc oxide, tin oxide, silicon nitride, and/or zinc stannate or other suitable material, and dielectric layer 8 of or including silicon nitride and/or silicon oxynitride or other suitable material. The silicon nitride layers (e.g., layer 8) may further include Al, oxygen, or the like, and the zinc oxide based layers may also include tin and/or aluminum. Other layers and/or materials may also be provided in the coating in certain example embodiments of this invention, and it is also possible that certain layers may be removed or split in certain example instances. For example, a zirconium oxide layer or an $AlSiBO_x$ layer (not shown) could be provided directly over and contacting silicon nitride layer 8. As another example, a medium index layer such as silicon nitride could be provided between the glass substrate 1 and high index layer 2. As another example, two silver based IR reflecting layers, spaced apart by a dielectric layer stack including tin oxide for instance, may be provided and the overcoat and/or undercoat of FIG. 1 may be used therein. Moreover, one or more of the layers discussed above may be doped with other materials in certain example embodiments of this invention. This invention is not limited to the layer stack shown in FIG. 1, as the FIG. 1 stack is provided for purposes of example only in order to illustrate an example location(s) for high index Y inclusive layer 2 (and possibly 6) discussed herein.

In monolithic instances, the coated article includes only one substrate such as glass substrate 1 (see FIG. 1). However, monolithic coated articles herein may be used in devices such as IG window units for example. Typically, an IG window unit may include two or more spaced apart substrates with an air gap defined therebetween. Example IG window units are illustrated and described, for example, in U.S. Pat. Nos. 5,770,321, 5,800,933, 6,524,714, 6,541,084 and US 2003/0150711, the disclosures of which are all hereby incorporated herein by reference. For example, the coated glass substrate shown in FIG. 1 may be coupled to another glass substrate via spacer(s), sealant(s) or the like with a gap being defined therebetween in an IG window unit. In certain example instances, the coating may be provided on the side of the glass substrate 1 facing the gap, i.e., surface #2 or surface #3. In other example embodiments, the IG window unit may include additional glass sheets (e.g., the IG unit may include three spaced apart glass sheets instead of two).

Transparent dielectric lower contact layer 3 may be of or include zinc oxide (e.g., ZnO), zinc stannate, or other suitable material. The zinc oxide of layer 3 may contain other materials as well such as Al (e.g., to form $ZnAlO_x$) or Sn in certain example embodiments. For example, in certain example embodiments of this invention, zinc oxide layer 3 may be doped with from about 1 to 10% Al (or B), more preferably from about 1 to 5% Al (or B), and most preferably about 2 to 4% Al (or B). The use of zinc oxide 3 under the silver in layer 4 allows for an excellent quality of silver to be achieved. Zinc oxide layer 3 is typically deposited in a crystalline state. In certain example embodiments (e.g., to be discussed below) the zinc oxide inclusive layer 3 may be formed via sputtering a ceramic ZnO or metal rotatable magnetron sputtering target.

Infrared (IR) reflecting layer 4 is preferably substantially or entirely metallic and/or conductive, and may comprise or consist essentially of silver (Ag), gold, or any other suitable IR reflecting material. The silver of IR reflecting layer 4 may be doped with other material(s), such as with Pd, Zn, or Cu, in certain example embodiments. IR reflecting layer 4 helps allow the coating to have low-E and/or good solar control characteristics such as low emittance, low sheet resistance, and so forth. The IR reflecting layer may, however, be slightly oxidized in certain embodiments of this invention. Multiple silver based IR reflecting layers 4 may be provided, spaced apart in low-E coating by at least one dielectric layer, in double or triple silver stacks including high index layers discussed herein in certain example embodiments of this invention.

Upper contact layer 5 is located over and directly contacting the IR reflecting layer 4, and may be of or include an oxide of Ni and/or Cr in certain example embodiments. In certain example embodiments, upper contact layer 5 may be of or include nickel (Ni) oxide, chromium/chrome (Cr) oxide, or a nickel alloy oxide such as nickel chrome oxide ($NiCrO_x$), or other suitable material(s) such as $NiCrMO_x$, NiCrMo, Ti, $NiTiNbO_x$, $TiO_x$, metallic NiCr, or the like. Contact layer 5 may or may not be oxidation graded in different embodiments of this invention. Oxidation grading means that the degree of oxidation in the layer changes through the thickness of the layer so that for example a contact layer may be graded so as to be less oxidized at the contact interface with the immediately adjacent IR reflecting layer 4 than at a portion of the contact layer further or more/most distant from the immediately adjacent IR reflecting layer. Contact layer 5 may or may not be continuous in different embodiments of this invention across the entire IR reflecting layer 4.

Other layer(s) below or above the illustrated FIG. 1 coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 2 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses may be used in different embodiments of this invention, example thicknesses and materials for the respective layers on the glass substrate 1 in the FIG. 1 embodiment may be as follows, from the glass substrate outwardly (e.g., the Al content in the zinc oxide and silicon nitride layers may be from about 1-10%, more preferably from about 1-5% in certain example instances). Thickness are in units of angstroms (Å).

TABLE 1

(Example Materials/Thicknesses; FIG. 1 Embodiment)

| Layer | Preferred Range (Å) | More Preferred (Å) | Example (Å) |
|---|---|---|---|
| Y-inclusive (layer 2) | 40-500 Å | 150-350 Å | 270 Å |
| ZnO or $ZnAlO_x$ (layer 3) | 10-240 Å | 35-120 Å | 40 Å |
| Ag (layer 4) | 40-160 Å | 65-125 Å | 110 Å |
| Contact (layer 5) | 10-70 Å | 20-50 Å | 34 Å |
| Layer 6 | 30-350 Å | 80-200 Å | 100 Å |
| ZnO or $ZnAlO_x$ or SiN (layer 7) | 10-240 Å | 35-120 Å | 40 Å |
| $Si_xN_y$ (layer 8) | 50-250 Å | 80-180 Å | 100 Å |

In certain example embodiments of this invention, coated articles herein (e.g., see FIG. 1) may have the following low-E (low emissivity), solar and/or optical characteristics set forth in Table 2 when measured monolithically.

TABLE 2

Low-E/Solar Characteristics (Monolithic)

| Characteristic | General | More Preferred | Most Preferred |
|---|---|---|---|
| $R_s$ (ohms/sq.): | <=11.0 | <=10 | <=9 |
| $E_n$: | <=0.2 | <=0.15 | <=0.10 |
| $T_{vis}$ (%): | >=50 | >=60 | >=70 |
| SHGC: | >=50 | >=53 | >=55 |

While high index transparent dielectric Y-inclusive layer 2 (and possibly 6) is shown and described in connection with the low-E coating of FIG. 1 above, this invention is not so limited. Yttrium inclusive high index nitrided dielectric layer 2 (and possibly 6) of or including YZrSiAlN, YZrSiN, YSiN, and/or YSiAlN described herein may be used as a high index layer(s) in any suitable low-E coating either above or below an IR reflecting layer(s). One or more of such yttrium inclusive high index nitrided dielectric layer(s) of or including YZrSiAlN, YZrSiN, YSiN, and/or YSiAlN may be provided in any suitable low-E coating. For example and without limitation, yttrium inclusive high index nitrided dielectric layers discussed herein of or including YZrSiAlN, YZrSiN, YSiN, and/or YSiAlN may be used to replace any high index (e.g., $TiO_x$ or $TiO_2$) layer in any of the low-E coatings in any of U.S. Pat. Nos. 9,212,417, 9,297,197, 7,390,572, 7,153,579, 9,365,450, and 9,403,345, all of which are incorporated herein by reference.

Figure 2:
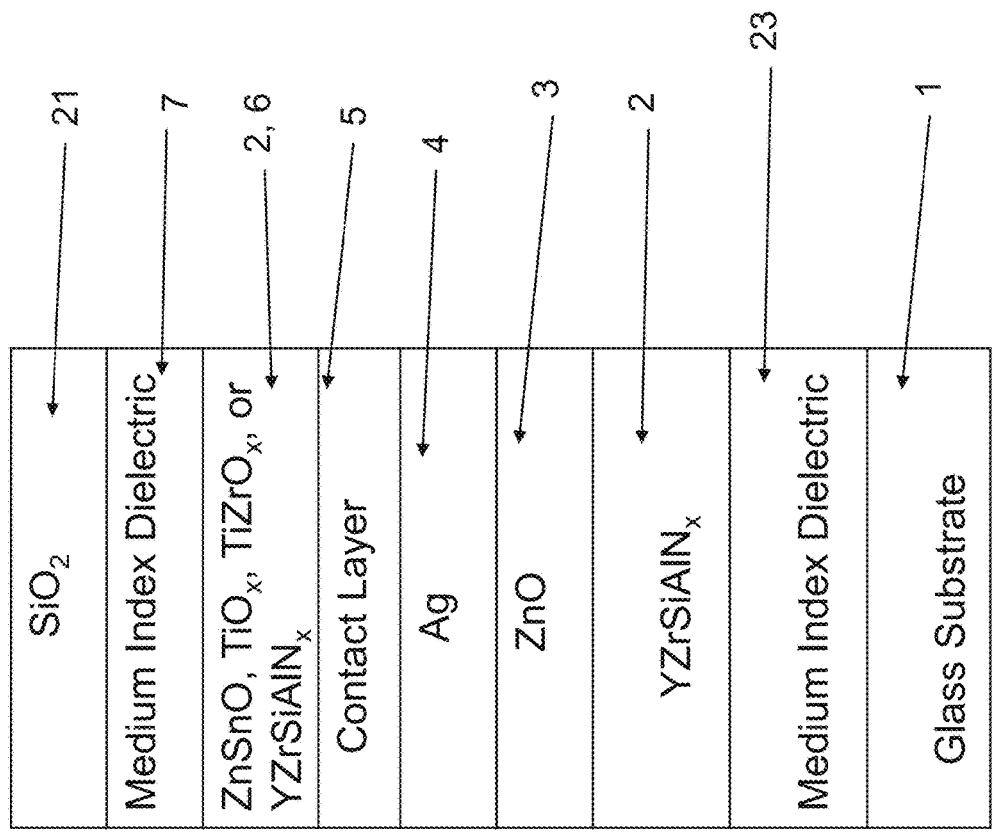
FIG. 2 is a cross sectional view of a coated article according to another example embodiment of this invention.

FIG. 2 is a cross sectional view of a coated article according to another example embodiment of this invention. FIG. 2 is similar to FIG. 1, except that in the FIG. 2 embodiment a medium index (n) layer 23 of or including material such as silicon nitride or zinc oxide is provided between and directly contacting the glass substrate 1 and the Y inclusive layer 2, and a low index layer 21 of a material such as $SiO_2$ is provided in place of layer 8.

Examples according to certain example embodiments of this invention are as follows.

EXAMPLE 1

Example 1 had a layer stack as follows, according to an example of the FIG. 1 embodiment, with layer thicknesses in units of nm.

| Ex. 1 Material | Layer thickness (nm) |
| --- | --- |
| Si$_3$N$_4$ | 29.1 |
| ZnAlO | 3 |
| TiZrO$_2$ | 9.7 |
| NiTiNbOx | 2.6 |
| Ag | 12 |
| ZnAlO | 4 |
| YZrSiAlN | 31.7 |
| Clear Glass (4 mm) | |

FIG. 6 shows the optical/thermal data for the coated article of Example 1. "AC" in FIG. 6 stands for as coated (i.e., before HT), and "HT" in FIG. 6 stands for after being heat treated which in Example 1 was heat treatment at about 650 degrees for about 8 minutes. The performance was excellent. The color is nearly neutral, and the color shift was very small that no significant color change occurred due to the heat treatment. Thermal stability is also demonstrated by the fact that normal emissivity (En) only changed from 0.044 to 0.037 due to the heat treatment, representing a change of 0.007. Moreover, SHGC AT 55.7 (AC) and 55.8 (HT) was higher than convention coatings using TiO$_2$ as a high index material (49), which is desirable in cold climate applications. In certain example embodiments of this invention, coated articles with a Y-inclusive layer are able to achieve an SHGC value of at least 50, more preferably of at least 53, and most preferably of at least 55.

EXAMPLE 2

Figure 4:
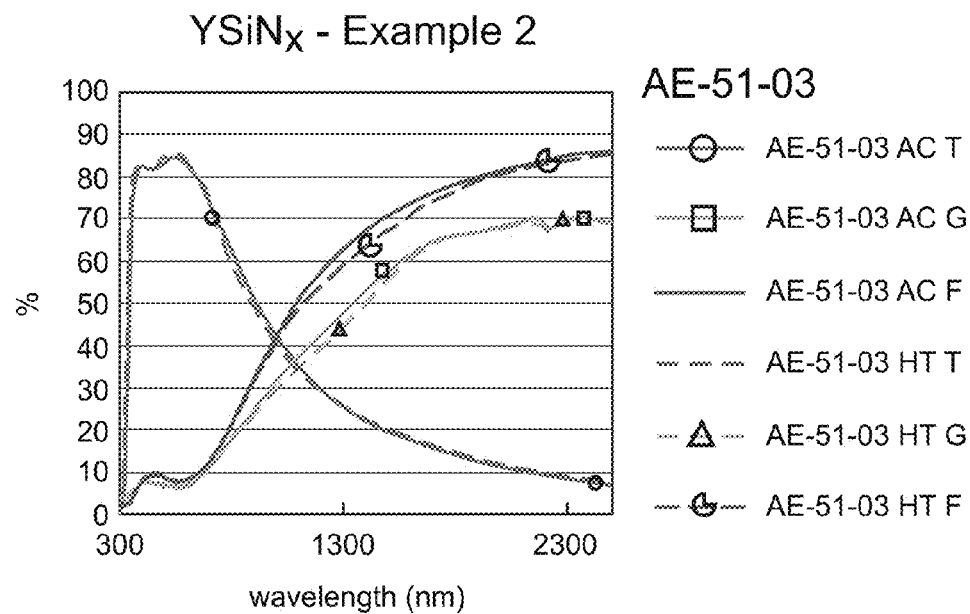
FIG. 4 is a percentage (%) versus wavelength (nm) graph plotting transmission (T) %, glass side reflection (G) %, and film side reflection (F) % of a layer stack including a high index YSiN layer versus wavelength (nm) in both as-coated (AC) and post-HT (HT) states.

Example 2 was a low-E coating on a glass substrate according to the FIG. 1 embodiment, for comparing to the Comparative Example (CE) of FIG. 3. The Example 2 layer stack was similar to the layer stack of the CE of FIG. 3, except that the TiO$_2$ layer in the CE was replaced in Example 2 with a layer of YSiN. FIG. 4 show the data of Example 2, before and after HT, and should be compared to the CE of FIG. 3. In FIGS. 3 and 4 at the right side where the curves are listed, the top three are "as coated" (AC) which means prior to the HT, and the bottom three are following the heat treatment and thus are labeled "HT." Thus, the AC curves are prior to HT, and the HT curves are after heat treatment at about 650 degrees C. for about eight minutes.

Comparing FIG. 4 to the Comparative Example (CE) in FIG. 3, significant unexpected differences are demonstrated resulting from the use of the YSiN layer 2. In FIG. 3, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability for the CE of FIG. 3. The Comparative Example (CE) of FIG. 3 shows a significant shift in the IR range of the transmission and reflectance spectra, and increases in emissivity and haze were also found. In contrast, upon replacing the titanium oxide layer of the CE with the YSiN layer of Example 2, FIG. 4 shows that in the wavelength area from about 1500 to 2400 nm there was very little shift due to HT from the "AC T" (transmission, as coated prior to HT) curve to the "HT T" (transmission, after HT) curve of less than 2%; there was very little shift due to HT from the "AC G" (glass side reflectance, as coated prior to HT) curve to the "HT G" (glass side reflectance, after HT) curve of less than 3%; and there was very little shift due to HT from the "AC F" (film side reflectance, as coated prior to HT) curve to the "HT F" (film side reflectance, after HT) curve of less than 2 or 3%. These much smaller shifts for Example 2 in FIG. 4 (compared to the CE of FIG. 2) demonstrate an unexpected improvement in thermal stability and heat treatability of the coating. Accordingly, comparing FIG. 4 to FIG. 3, it can be seen that Example 2 was surprisingly and unexpectedly improved compared to the CE with respect to thermal stability and heat treatability (e.g., thermal tempering).

EXAMPLES 3-4

Figure 5:
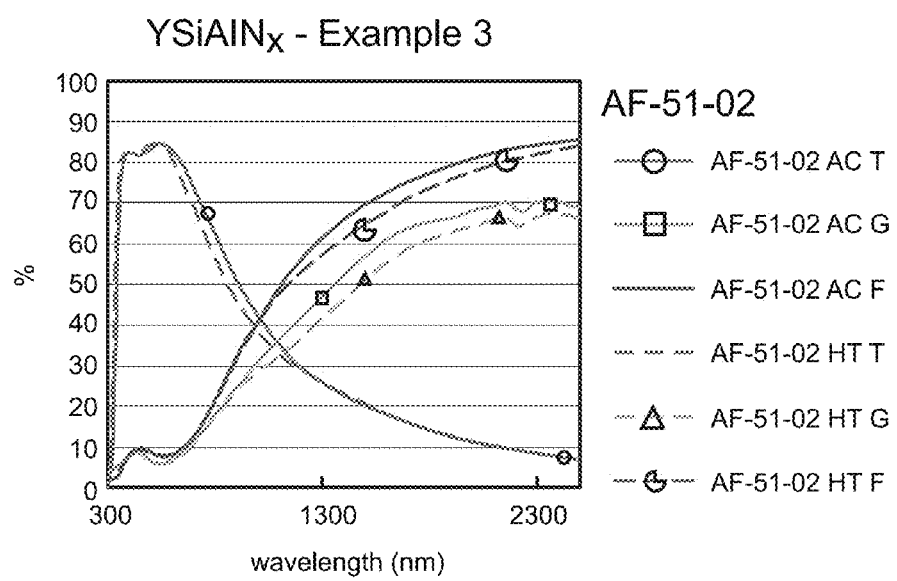
FIG. 5 is a percentage (%) versus wavelength (nm) graph plotting transmission (T) %, glass side reflection (G) %, and film side reflection (F) % of a layer stack including a high index YSiAlN layer versus wavelength (nm) in both as-coated (AC) and post-HT (HT) states.

Example 3 was a low-E coating on a glass substrate according to the FIG. 1 embodiment, for comparing to the Comparative Example (CE) of FIG. 3. The Example 3 layer stack was similar to the layer stack of the CE of FIG. 3, except that the TiO$_2$ layer in the CE was replaced in Example 3 with a layer of YSiAlN. FIG. 5 show the data of Example 3, before and after HT, and should be compared to the CE of FIG. 3. In FIGS. 3 and 5 at the right side where the curves are listed, the top three are "as coated" (AC) which means prior to the HT, and the bottom three are following the heat treatment and thus are labeled "HT." Thus, the AC curves are prior to HT, and the HT curves are after heat treatment at about 650 degrees C. for about eight minutes.

Comparing FIG. 5 to the Comparative Example (CE) in FIG. 3, significant unexpected differences are demonstrated resulting from the use of the YSiAlN layer 2. In FIG. 3, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability for the CE of FIG. 3. The Comparative Example (CE) of FIG. 3 shows a significant shift in the IR range of the transmission and reflectance spectra, and increases in emissivity and haze were also found. In contrast, upon replacing the titanium oxide layer of the CE with the YSiAlN layer of Example 3, FIG. 5 shows that in the wavelength area from about 1500 to 2400 nm there was very little shift due to HT from the "AC T" (transmission, as coated prior to HT) curve to the "HT T" (transmission, after HT) curve of less than 2%; there was very little shift due to HT from the "AC G" (glass side reflectance, as coated prior to HT) curve to the "HT G" (glass side reflectance, after HT) curve of less than 4%; and there was very little shift due to HT from the "AC F" (film side reflectance, as coated prior to HT) curve to the "HT F" (film side reflectance, after HT) curve of less than 4%. These much smaller shifts due to HT for Example 3 in FIG. 5 (compared to the CE of FIG. 2) demonstrate an unexpected improvement in thermal stability and heat treatability of the coating. Accordingly, comparing FIG. 5 to FIG. 3, it can be seen that Example 3 was surprisingly and unexpectedly improved compared to the CE with respect to thermal stability and heat treatability (e.g., thermal tempering).

Example 4 had the following layer stack.

```
SiAlBOx
Si3N4
YiZrAlN
NiTiNbOx
Ag
ZnAlO
YiZrAlN
Clear Glass
(4 mm)
```

FIG. 7 sets forth the optical/thermal data for the coated article of Example 4. In addition to the benefits of the Y-inclusive dielectrics discussed above, it was found that the silicon nitride layer in the overcoat of Example 4 was also particularly advantageous. First, the silicon nitride layer (see layer 7 in FIGS. 1-2) in the overcoat is an excellent moisture and oxygen barrier that efficiently protects silver from oxygen or moisture attach, even at high temperature high humidity conditions. Second, there was good adhesion between the silicon nitride and both SiBAlO$_x$ and YZrAlN. Third, without 16 nm of silicon nitride in Example 4, the SiBAlO needs significantly more thickness to achieve the optimized performance, which would significantly reduce throughput. Fouth, the optical performance, especial SHGC was slightly improved with the silicon nitride layer compared to if it was not present. Thus, the unique stack design combining YZrSiN/Si3N4/SiAlBO$_x$ materials, was found to benefit good optical and thermal performance, as well as extremely high throughput.

In an example embodiment of this invention, there is provided a coated article including a coating supported by a glass substrate, the coating comprising: a first dielectric layer on the glass substrate; an infrared (IR) reflecting layer comprising silver on the glass substrate, located over at least the first dielectric layer; a second dielectric layer on the glass substrate, located over at least the IR reflecting layer; and wherein at least one of the first and second dielectric layers comprises a nitride of yttrium (Y), contains from 0-10% oxygen (atomic %), has a refractive index (n) of at least 2.21 at 550 nm, and further comprises at least one of Zr, Si, and Al.

In the coated article of the immediately preceding paragraph, the layer comprising the nitride of Y may further comprises Si.

In the coated article of any of the preceding two paragraphs, the layer comprising the nitride of Y may further comprise Si and Al.

In the coated article of any of the preceding three paragraphs, the layer comprising the nitride of Y may further comprise Zr.

In the coated article of any of the preceding four paragraphs, the layer comprising the nitride of Y may further comprise Zr and Si.

In the coated article of any of the preceding five paragraphs, the layer comprising the nitride of Y may further comprise Zr, Si and Al.

In the coated article of any of the preceding six paragraphs, the layer comprising the nitride of Y may have a refractive index of at least 2.25.

In the coated article of any of the preceding seven paragraphs, the layer comprising the nitride of Y may have an absorption coefficient (k) of no greater than 0.015, more preferably of no greater than 0.010 (at 400 nm).

In the coated article of any of the preceding eight paragraphs, the coated article may undergo a change in refractive index (n), at 550 nm, of no more than 0.10 (more preferably no more than 0.04, and most preferably no more than 0.01) due to heat treatment at 650° C. heat treatment for 8 minutes.

In the coated article of any of the preceding nine paragraphs, the layer comprising the nitride of Y may contain from 0-5% oxygen, more preferably from 0-2% oxygen (atomic %).

In the coated article of any of the preceding ten paragraphs, the coating may be a low-E coating and have a normal emissivity (En) of no greater than 0.2, more preferably of no greater than 0.10.

In the coated article of any of the preceding eleven paragraphs, the layer comprising the nitride of Y may be amorphous or substantially amorphous.

In the coated article of any of the preceding twelve paragraphs, the first dielectric layer may comprise the nitride of yttrium (Y), may contain from 0-10% oxygen (atomic %), may have a refractive index (n) of at least 2.21 at 550 nm, may have an absorption coefficient k of no greater than 0.02 at 400 nm, and further may comprise at least one of Zr, Si, and Al, and be located between at least the glass substrate and the IR reflecting layer.

In the coated article of any of the preceding thirteen paragraphs, the second dielectric layer may comprise the nitride of yttrium (Y), may contain from 0-10% oxygen (atomic %), may have a refractive index (n) of at least 2.21 at 550 nm, may have an absorption coefficient k of no greater than 0.02 at 400 nm, and may further comprise at least one of Zr, Si, and Al, and is located on the glass substrate over at least the IR reflecting layer.

In the coated article of any of the preceding fourteen paragraphs, the coating may further comprise a layer comprising silicon nitride located over and directly contacting the layer comprising the nitride of Y. The coating may further comprise an overcoat comprising an oxide of Si and Al, and further comprising B, located over and directly contacting the layer comprising silicon nitride.

In the coated article of any of the preceding fifteen paragraphs, the coating may further comprise a layer comprising silicon nitride located between at least the glass substrate and the first transparent dielectric layer.

In the coated article of any of the preceding sixteen paragraphs, the coating may further comprise a layer comprising zinc oxide located under and directly contacting the IR reflecting layer.

In the coated article of any of the preceding seventeen paragraphs, the coating may further comprises a layer comprising an oxide of Ni and/or Cr located over and directly contacting the IR reflecting layer.

In the coated article of any of the preceding eighteen paragraphs, the coated article may be thermally tempered.

In the coated article of any of the preceding nineteen paragraphs, the coated article may have a visible transmission of at least 50%, more preferably of at least 60%, and most preferably of at least 70%.

In the coated article of any of the preceding twenty paragraphs, the coated article may have an SHGC value of at least 50, more preferably of at least 55.

In the coated article of any of the preceding twenty one paragraphs, the layer comprising the nitride of Y may have a metal content comprising one or more of: (i) from 20-70% Y, more preferably from 25-65% Y, even more preferably from 30-50% Y, and most preferably from 33-45% Y (atomic %); (ii) from 0-30% Zr, more preferably from 1-30% Zr, even more preferably from 3-13% Zr, and most preferably from 4-10% Zr (atomic %); (iii) from 30-80% Si, more preferably from 40-70% Si, even more preferably from 45-65% Si (atomic %); and (iv) from 0-30% Al, more preferably from 1-30% Al, even more preferably from 1-8% Al, and most preferably from 2-6% Al (atomic %). The layer comprising the nitride of Y may contain more Si than Y, such as at least 10% more Si than Y (atomic %).

In the coated article of any of the preceding twenty two paragraphs, the layer comprising the nitride of Y may be free of, or substantially free of, Ti and/or Nb. The layer comprising the nitride of Y may contain from 0-10% of Ti, more preferably from 0-5% Ti, and most preferably from 0-2% of Ti (atomic %). The layer comprising the nitride of Y may contain from 0-10% of Nb, more preferably from 0-5% Nb, and most preferably from 0-2% of Nb.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article including a coating supported by a glass substrate, the coating comprising:
   a first dielectric layer on the glass substrate;
   an infrared (IR) reflecting layer comprising silver on the glass substrate, located over at least the first dielectric layer;
   a second dielectric layer on the glass substrate, located over at least the IR reflecting layer; and
   wherein at least one of the first and second dielectric layers comprises a nitride of yttrium (Y), contains from 0-10% oxygen (atomic %), has a refractive index (n) of at least 2.21 at 550 nm, and further comprises at least one of Zr, Si, and Al.

2. The coated article of claim 1, wherein the layer comprising the nitride of Y further comprises Si.

3. The coated article of claim 1, wherein the layer comprising the nitride of Y further comprises Si and Al.

4. The coated article of claim 1, wherein the layer comprising the nitride of Y further comprises Zr.

5. The coated article of claim 1, wherein the layer comprising the nitride of Y further comprises Zr and Si.

6. The coated article of claim 1, wherein the layer comprising the nitride of Y further comprises Zr, Si and Al.

7. The coated article of claim 1, wherein the layer comprising the nitride of Y has a refractive index of at least 2.25 (at 550 nm).

8. The coated article of claim 1, wherein the layer comprising the nitride of Y has an absorption coefficient (k) of no greater than 0.015 (at 400 nm).

9. The coated article of claim 1, wherein the layer comprising the nitride of Y has an absorption coefficient (k) of no greater than 0.010 (at 400 nm).

10. The coated article of claim 1, wherein the coated article undergoes a change in refractive index (n), at 550 nm, of no more than 0.04 due to heat treatment at 650° C. heat treatment for 8 minutes.

11. The coated article of claim 1, wherein the coated article undergoes a change in refractive index (n), at 550 nm, of no more than 0.01 due to heat treatment at 650° C. heat treatment for 8 minutes.

12. The coated article of claim 1, wherein the layer comprising the nitride of Y contains from 0-5% oxygen (atomic %).

13. The coated article of claim 1, wherein the layer comprising the nitride of Y contains from 0-2% oxygen (atomic %).

14. The coated article of claim 1, wherein the coating is a low-E coating and has a normal emissivity (En) of no greater than 0.2.

15. The coated article of claim 1, wherein the coating is a low-E coating and has a normal emissivity (En) of no greater than 0.10.

16. The coated article of claim 1, wherein the layer comprising the nitride of Y is amorphous or substantially amorphous.

17. The coated article of claim 1, wherein the first dielectric layer comprises the nitride of yttrium (Y), contains from 0-10% oxygen (atomic %), has a refractive index (n) of at least 2.21 at 550 nm, has an absorption coefficient k of no greater than 0.02 at 400 nm, and further comprises at least one of Zr, Si, and Al, and is located between at least the glass substrate and the IR reflecting layer.

18. The coated article of claim 1, wherein the second dielectric layer comprises the nitride of yttrium (Y), contains from 0-10% oxygen (atomic %), has a refractive index (n) of at least 2.21 at 550 nm, has an absorption coefficient k of no greater than 0.02 at 400 nm, and further comprises at least one of Zr, Si, and Al, and is located on the glass substrate over at least the IR reflecting layer.

19. The coated article of claim 18, wherein the coating further comprises a layer comprising silicon nitride located over and directly contacting the layer comprising the nitride of Y.

20. The coated article of claim 19, wherein the coating further comprising an overcoat comprising an oxide of Si and Al, and further comprises B, located over and directly contacting the layer comprising silicon nitride.

21. The coated article of claim 1, wherein the coating further comprises a layer comprising silicon nitride located between at least the glass substrate and the first transparent dielectric layer.

22. The coated article of claim 1, wherein the coating further comprises a layer comprising zinc oxide located under and directly contacting the IR reflecting layer.

23. The coated article of claim 1, wherein the coating further comprises a layer comprising an oxide of Ni and/or Cr located over and directly contacting the IR reflecting layer.

24. The coated article of claim 1, wherein the coated article is thermally tempered.

25. The coated article of claim 1, wherein the coated article has a visible transmission of at least 50%.

26. The coated article of claim 1, wherein the layer comprising the nitride of Y has a metal content comprising from 25-65% Y (atomic %).

27. The coated article of claim 1, wherein the layer comprising the nitride of Y has a metal content comprising from 30-50% Y (atomic %).

28. The coated article of claim 1, wherein the layer comprising the nitride of Y has a metal content comprising from 33-45% Y (atomic %).

29. The coated article of claim 1, wherein the layer comprising the nitride of Y has a metal content comprising from 25-65% Y, from 1-30% Zr, from 30-80% Si, and from 0-30% Al (atomic %).

30. The coated article of claim 1, wherein the layer comprising the nitride of Y contains more Si than Y (atomic %).

31. The coated article of claim 1, wherein the layer comprising the nitride of Y is substantially free of Ti and Nb.

32. The coated article of claim 1, wherein the layer comprising the nitride of Y contains from 0-5% Ti and from 0-5% Nb (atomic %).

33. A coated article including a coating supported by a glass substrate, the coating comprising:
   a first dielectric layer on the glass substrate;
   an infrared (IR) reflecting layer on the glass substrate, located over at least the first dielectric layer;
   a second dielectric layer on the glass substrate, located over at least the IR reflecting layer;
   a third dielectric layer on the glass substrate and located over at least the first and second dielectric layers; and
   wherein at least one of the first and second dielectric layers comprises a nitride of yttrium (Y), and further comprises at least one of Zr, Si, and Al.

34. The coated article of claim 33, wherein the third dielectric layer comprises silicon nitride.

35. The coated article of claim 33, wherein the layer comprising the nitride of Y further comprises Si.

36. The coated article of claim 33, wherein the layer comprising the nitride of Y further comprises Si and Al.

37. The coated article of claim 33, wherein the layer comprising the nitride of Y further comprises Zr.

38. The coated article of claim 33, wherein the layer comprising the nitride of Y further comprises Zr and Si.

39. The coated article of claim 33, wherein the layer comprising the nitride of Y further comprises Zr, Si and Al.

40. The coated article of claim 33, wherein the layer comprising the nitride of Y has a refractive index of at least 2.21 (at 550 nm).

41. The coated article of claim 33, wherein the layer comprising the nitride of Y has a metal content comprising from 25-65% Y (atomic %).

42. The coated article of claim 33, wherein the layer comprising the nitride of Y is substantially free of Ti and Nb.

43. The coated article of claim 33, wherein the layer comprising the nitride of Y contains from 0-5% Ti and from 0-5% Nb (atomic %).

44. A method of making a coated article including a coating supported by a glass substrate, the method comprising:
   sputter depositing a first dielectric layer on the glass substrate;
   sputter depositing a second dielectric layer on the glass substrate, located over at least the first dielectric layer;
   sputter depositing a third dielectric layer on the glass substrate and located over at least the first and second dielectric layers; and
   wherein at least one of the first and second dielectric layers comprises a nitride of yttrium (Y), and further comprises at least one of Zr, Si, and Al.

45. The method of claim 44, wherein the third dielectric layer comprises silicon nitride.

46. The method of claim 44, wherein the layer comprising the nitride of Y further comprises Si.

47. The method of claim 44, wherein the layer comprising the nitride of Y further comprises Si and Al.

48. The method of claim 44, wherein the layer comprising the nitride of Y further comprises Zr.

49. The method of claim 44, wherein the layer comprising the nitride of Y further comprises Zr and Si.

50. The method of claim 44, wherein the layer comprising the nitride of Y further comprises Zr, Si and Al.

51. The method of claim 44, wherein the layer comprising the nitride of Y has a refractive index of at least 2.25 (at 550 nm).

52. The method of claim 44, wherein the layer comprising the nitride of Y has an absorption coefficient (k) of no greater than 0.015 (at 400 nm).

53. The method of claim 44, wherein the layer comprising the nitride of Y is substantially free of Ti and Nb.

* * * * *